(12) United States Patent
Erickson et al.

(10) Patent No.: US 7,535,330 B2
(45) Date of Patent: May 19, 2009

(54) LOW MUTUAL INDUCTANCE MATCHED INDUCTORS

(75) Inventors: Sean Christopher Erickson, Fort Collins, CO (US); Jason Dee Hudson, Eaton, CO (US); Michael J. Saunders, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 265 days.

(21) Appl. No.: 11/534,340

(22) Filed: Sep. 22, 2006

(65) Prior Publication Data

US 2008/0074228 A1    Mar. 27, 2008

(51) Int. Cl.
*H01F 5/00* (2006.01)
(52) U.S. Cl. .................................................. 336/200
(58) Field of Classification Search ............... 336/200, 336/223, 232, 65, 83; 333/181, 167, 185, 333/24 R; 257/531
See application file for complete search history.

(56) References Cited

U.S. PATENT DOCUMENTS

| | | | | |
|---|---|---|---|---|
| 6,577,219 B2* | 6/2003 | Visser | ......................... | 336/200 |
| 6,798,326 B2* | 9/2004 | Iida | ............................. | 336/200 |
| 6,882,263 B2* | 4/2005 | Yang et al. | ................... | 336/200 |
| 7,057,488 B2* | 6/2006 | Van Haaren et al. | ........ | 336/200 |
| 7,068,140 B2* | 6/2006 | Chou | ......................... | 336/200 |
| 7,151,430 B2* | 12/2006 | Mattsson | ..................... | 336/200 |
| 7,256,646 B2* | 8/2007 | Eid et al. | ..................... | 327/563 |
| 2005/0195061 A1* | 9/2005 | Terrovitis | ................... | 336/200 |

* cited by examiner

*Primary Examiner*—Tuyen T. Nguyen
(74) *Attorney, Agent, or Firm*—North, Weber & Baugh

(57) ABSTRACT

Multiple inductor structures and methods for providing low mutual inductance between the inductors are described. In various embodiments of the invention, the polarities of the inductors are positioned such that parasitic mutual inductance is reduced by causing electro-magnetic fields to at least partially cancel resulting in a reduction in interference between the inductors. The polarities of the magnetic fields produced by each inductor are opposite to each other so that at least a partial cancellation results when the fields interfere with each other.

20 Claims, 5 Drawing Sheets

LOW MUTUAL INDUCTANCE MATCHED INDUCTORS

BACKGROUND

A. Technical Field

This invention relates generally to electro-magnetic induction and interference, and more particularly, to the design of inductor coil elements within a semiconductor device.

B. Background of the Invention

Technological advancements in semiconductor manufacturing and electronic circuit design have resulted in a continual increase of component density within electrical circuits. These improvements in component density have resulted in a more efficient use of silicon area within the chip and a lower cost of production for each chip.

As the proximity of electrical components increases, the affects of electrical cross-coupling or crosstalk may significantly degrade the performance of the circuit. The impact of electrical cross-coupling is a more significant issue in circuits that are operating at high frequencies. Oftentimes, these high speed circuits need to be specifically designed to address interference and cross-coupling in order to comply with electro-magnetic compatibility ("EMC") requirements.

The design and placement of electrical components, such as inductors, within a circuit may significantly affect the electro-magnetic emission from a circuit and the cross-coupling therein. For example, inductors that are sufficiently proximate to each other may reduce the electrical performance of each other through parasitic mutual inductance. In particular, inductor coils produce external magnetic fields that can modify electrical characteristics, such as voltage or current responses, of other inductor coils. In order to reduce the amount of inductor cross-coupling, circuit designers have been forced to provide a sufficient distance between inductor coils so that electro-magnetic interference between the coils is reduced.

FIG. 1 illustrates this electro-magnetic interaction between to proximate inductor coils. As shown, a first inductor $L_1$ 102 and a second inductor $L_2$ 104 are located sufficiently close to each other so that cross-coupling occurs. The polarity of the inductors, $L_1$ 102 and $L_2$ 104, are shown such that the polarities are symmetrical and current is flowing through the inductors in the same direction. In particular, current $I_1$ 112 in the first inductor $L_1$ 102 is flowing in the same direction or substantially similar direction as current $I_2$ 114 flowing in the second inductor $L_2$ 104.

The magnetic field produced in the first inductor $L_1$ 102 interferes with the magnetic field produced in the second inductor $L_2$ 104 resulting in magnetic field interference between the two inductors. This interference may be constructive resulting in larger magnitude magnetic fields. As a result of this interference, the first current $I_1$ 112 in the first inductor $L_1$ 102 and the second current $I_2$ 114 in the second inductor $L_2$ 104 are undesirably affected by the interference. As one of the currents changes, the electro-magnetic fields change and affect the other current accordingly.

Circuits having multiple inductors must properly address this electro-magnetic interference, or cross-coupling, so that the circuit functions consistently and properly. FIG. 2 illustrates an exemplary differential low noise amplifier ("DLNA") in which inductor interference can potentially be an issue. Inductors $L_{d1}$ 202 and $L_{d2}$ 204 are required to be separated by a minimum distance within the semiconductor so that interference falls within a tolerable range. Inductors in series may also be affected by each other when in close proximity. Source inductors $L_{s1}$ 207a and $L_{s2}$ 207b share a common node and are therefore required to be kept close to the differential FET 209a and 209b. Such restriction makes the placement of the inductors difficult to implement on chip.

One skilled in the art will recognize that the circuit design, including the inductor values and location within the semiconductor, is designed in accordance with a "far resonance" configuration. Other design configurations may also be employed to sufficiently reduce inductor parasitic cross inductance between components therein. These constraints may reduce the component density within circuits as well as present constraints in the design and implementation of various circuits.

SUMMARY OF THE INVENTION

Multiple inductor structures and methods for providing low mutual inductance between the inductors are described. In various embodiments of the invention, the polarities of the inductors are positioned such that parasitic mutual inductance is reduced by causing electro-magnetic fields to at least partially cancel resulting in a reduction in interference between the inductors. In particular, the polarities of the magnetic fields produced by each inductor are opposite to each other so that at least a partial cancellation results when the fields interfere with each other.

The inductor design may be implemented in numerous different circuits in which multiple inductors may be located proximate to each other. The field cancellation that occurs at interference points results in a reduction in parasitic mutual induction and a reduction in crosstalk between the inductors. According to various embodiments of the invention, a first inductor is wound in a first direction, creating an inductor coil having an associated polarity. A second inductor is counter wound, relative to the first inductor, creating another inductor coil having a relatively opposite polarity.

These inductors may have a common node from which the coils begin. Magnetic field cancellation occurs as a result of the oppositely oriented magnetic fields created by the inductor coils. The inductors may be provided in various forms such as conventional octagonal and conventional spiral structures. The number of inductors may vary depending on the circuit in which the present invention is implemented.

Because the invention minimizes the crosstalk between inductors placed in close proximity to each other, the overall chip geometry may be reduced and component density improved. In implementations such as a DLNA, the counter wound inductor design having a common node may be utilized. These implementations help in maintaining the reliability of the circuit and components therein.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

Multiple inductor structures and methods for providing low mutual inductance between the inductors are described. In various embodiments of the invention, the polarities of the inductors are positioned such that parasitic mutual inductance is reduced by causing electro-magnetic fields to at least partially cancel resulting in a reduction in interference between the inductors. The polarities of the magnetic fields produced by each inductor are opposite to each other so that at least a partial cancellation results when the fields interfere with each other. In certain embodiments of the invention, the inductors are counter wound and share a common node resulting in inverse polarities between the inductors. The inductors may be provided in various forms such as conventional octagonal, and conventional spiral.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different circuit implementations utilizing inductor components. Structures and devices shown below in block diagram are illustrative of exemplary embodiments of the invention and are meant to avoid obscuring the invention. Furthermore, shapes of the components within the figures are not intended to be limited to the specified shapes. Rather, the structure of individual inductors may be modified, or otherwise be reshaped.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

Figure 1:
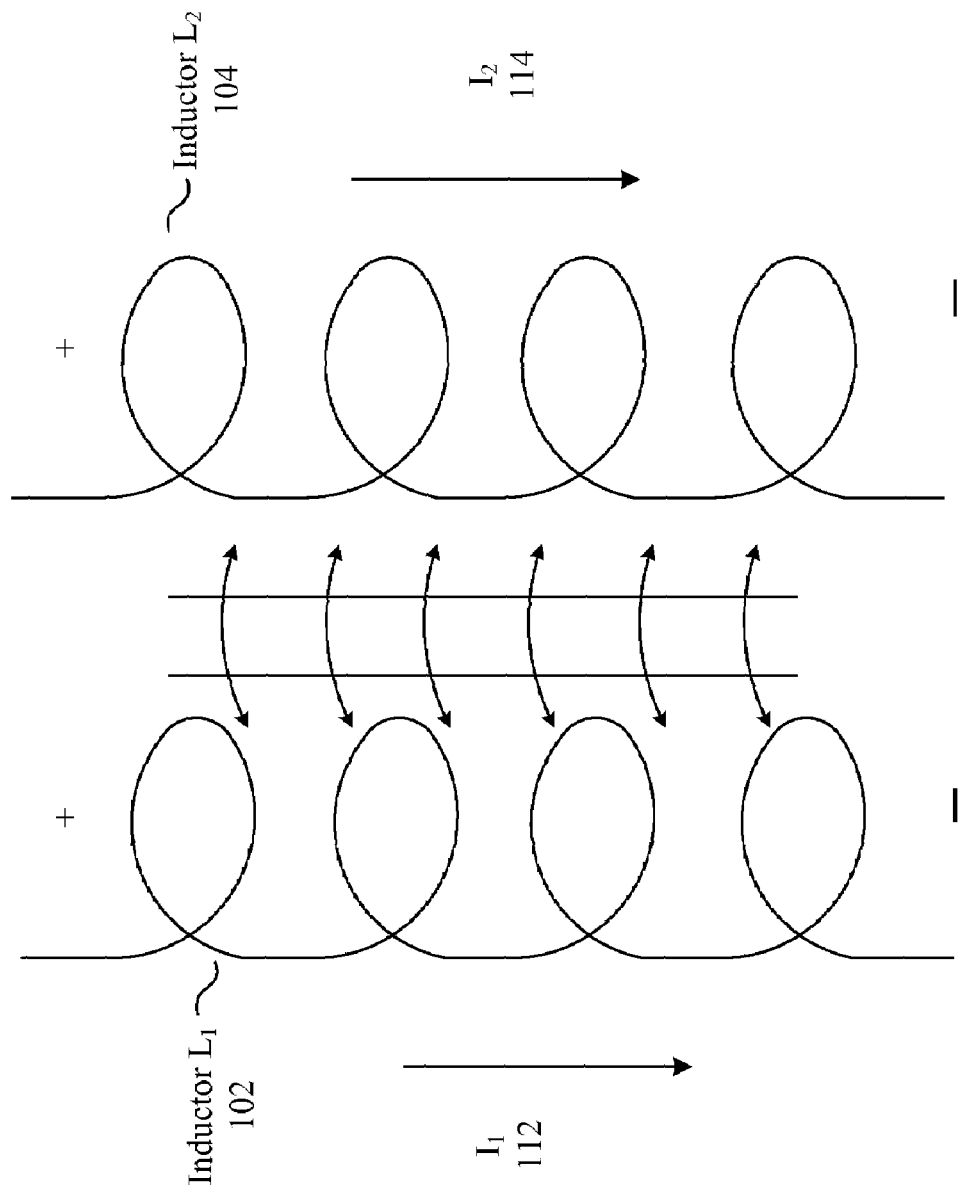
FIG. 1 is a general block diagram illustrating mutual inductance caused between inductors.
Figure 2:
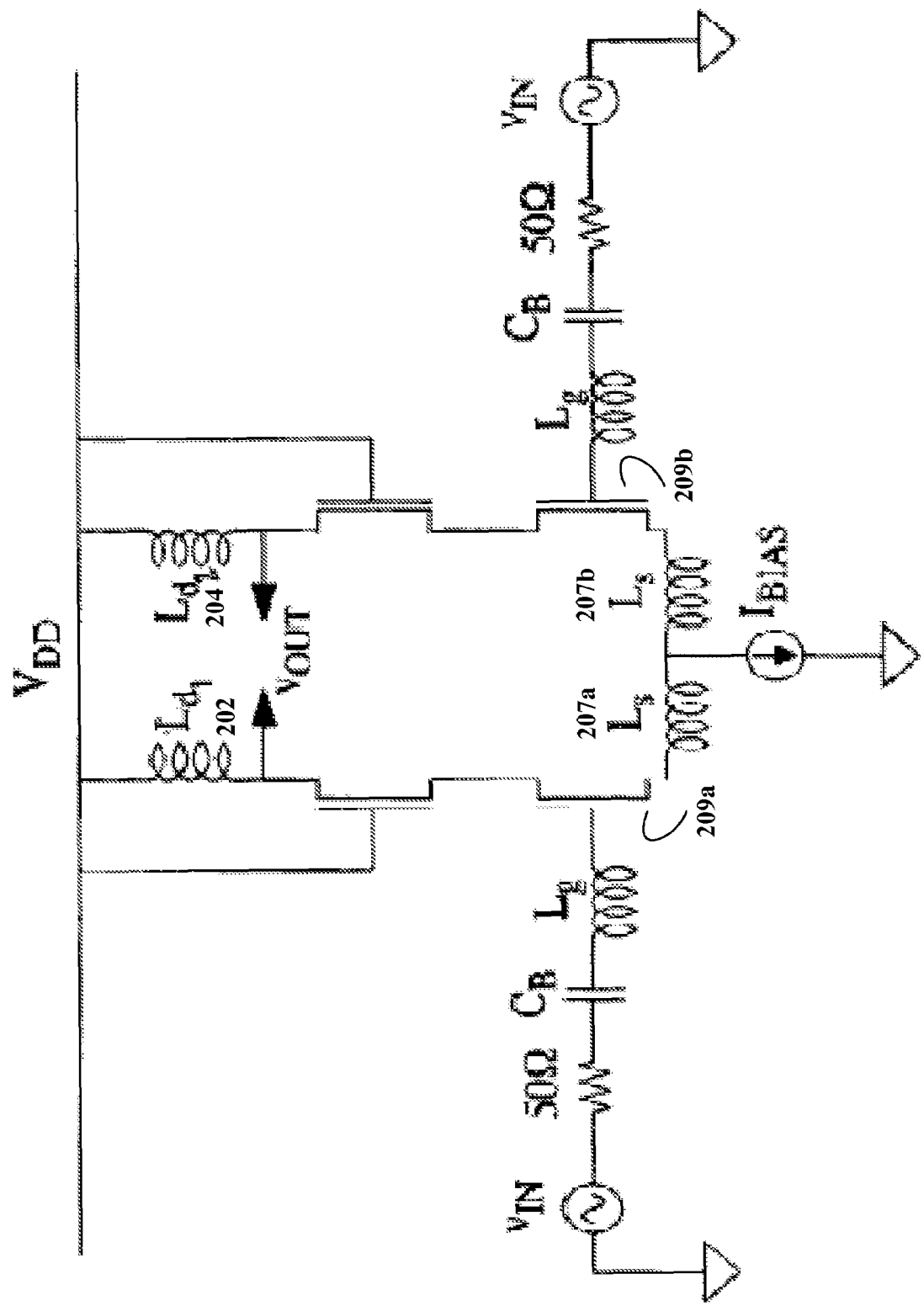
FIG. 2 illustrates a schematic diagram of a differential low noise amplifier ("DLNA").
Figures 3A, 3B:
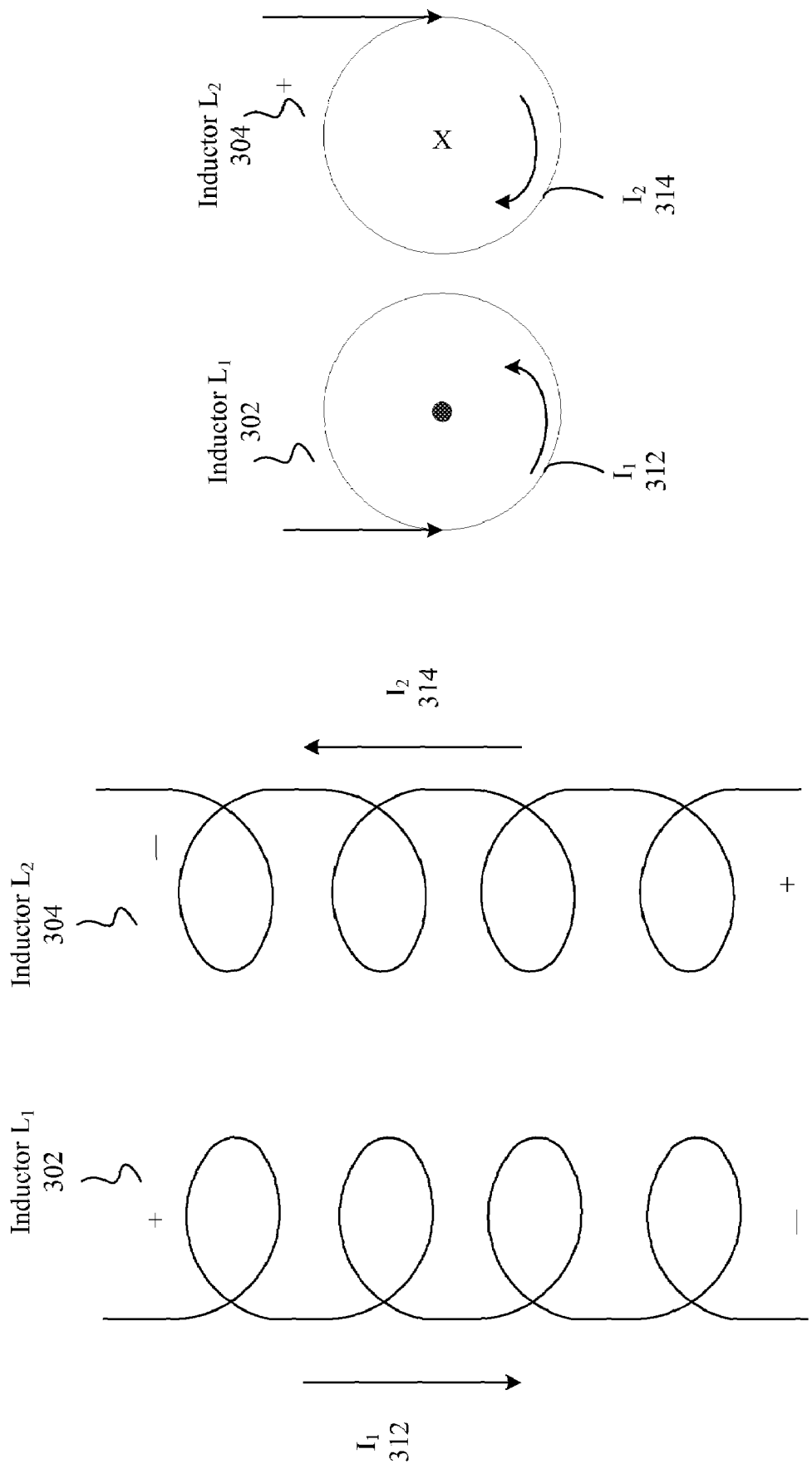
FIGS. 3a and 3b illustrate a schematic diagram of inductor design according to various embodiments of the invention.

FIG. 3a illustrates a schematic diagram of an inductor pair structure according to various embodiments of the present invention. A first inductor $L_1$ 302 and a second inductor $L_2$ 304 are structured such that one inductor is counter wound with respect to the other. The current flowing in the inductors may be in same direction or may be in opposite directions depending on the circuit design. For example, current $I_1$ 312 in the first inductor $L_1$ 302 may flow in a first direction and current $I_2$ 314 in the second inductor $L_2$ 304 may flow in a second direction that is opposite or substantially opposite of the first direction.

A positive pole on the first inductor $L_1$ 302 is aligned with a negative pole on the second inductor $L_2$ 304. A negative pole on the first inductor $L_1$ 302 is aligned with a positive pole on the second inductor $L_2$ 304. The current $I_1$ 312 flowing in the first inductor $L_1$ 302 causes a magnetic field in the dielectric of the inductor coil and the orientation of the magnetic field corresponds with the position of the positive and negative poles of the first inductor $L_1$ 302. The current $I_2$ 314 flowing in the second inductor $L_2$ 304 causes a magnetic field having an opposite orientation with respect to the field caused in inductor $L_1$ 302. It is important to note that in other embodiments of the invention, current $I_1$ 312 and current $I_2$ 314 may flow in the same direction.

FIG. 3b illustrates a top view implementation of multiple inductors that cancel parasitic mutual inductance according to various embodiments of the invention. The flow of current as seen from top indicates the flow of current $I_1$ 312 in the first inductor L2 302 in a counter clockwise direction. The current $I_2$ 314 in the second inductor 304 flows in clockwise direction. Coil windings of the first inductor $L_1$ 302 run counter clockwise starting from the top causing a magnetic field oriented out of the plane of the paper depicted in FIG. 3b. The second inductor $L_2$ 304 coil is wound clockwise from top leading to a magnetic field that is oriented into the plane of the paper.

The opposing orientations of the magnetic fields in each inductor cause at least a partial cancellation of magnetic field at the points of interference. Accordingly, the mutual inductance in the first inductor $L_1$ 302 coil caused due to the presence of the second inductor $L_2$ 304 is reduced. Also, the mutual inductance in the second inductor $L_2$ 304 caused by the first inductor $L_1$ 302 is also reduced.

One skilled in the art will recognize that the inductor coils may be manufactured using various methods. In various embodiments of the invention, an inductor coil is created using a multilayer configuration in which coil segments are created on stacked layers in a semiconductor. These layers are electrically coupled using vias connecting the coil segments. A resulting inductor coil is created that vertically penetrates the semiconductor on which an electrical circuit is implemented.

B. Inductance Circuit Design and Manufacturing

Figure 4:
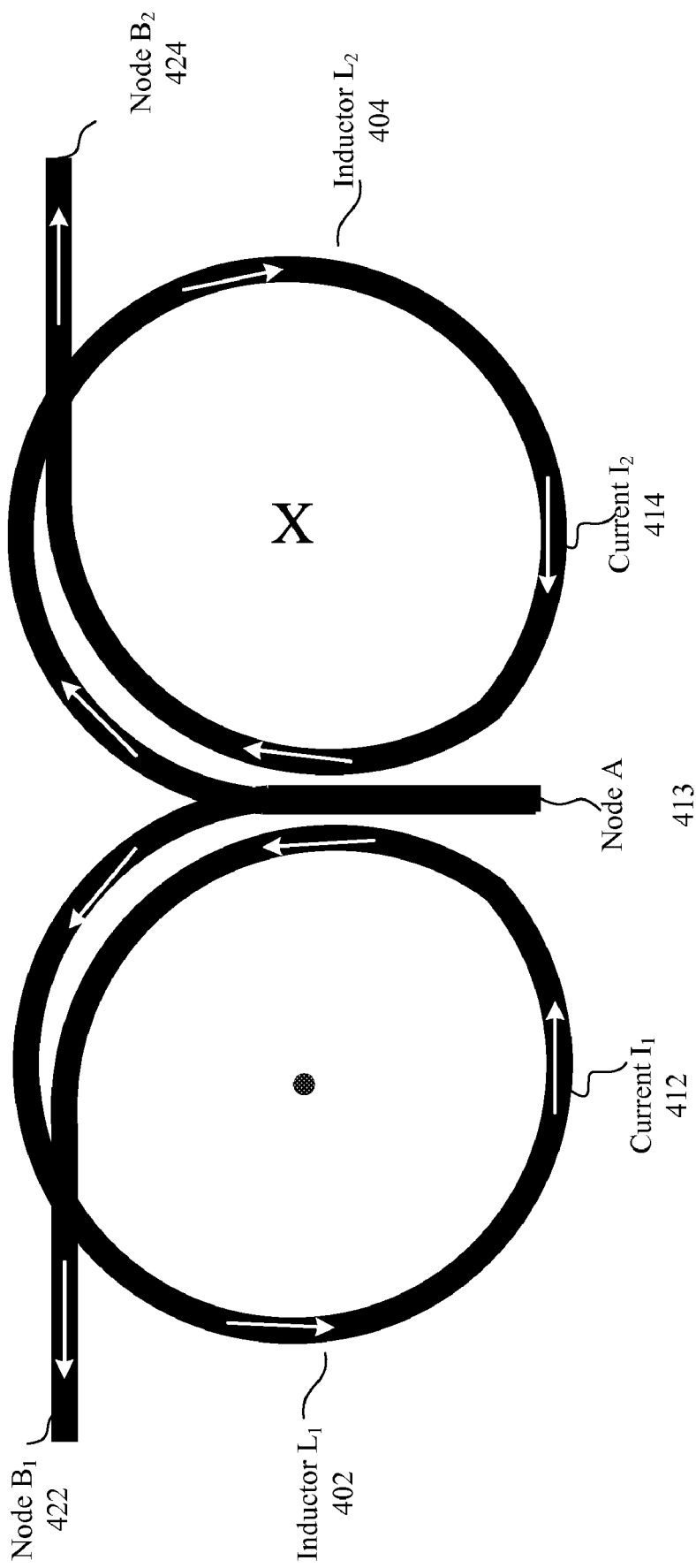
FIG. 4 shows a conventional spiral inductor design according to various embodiments of the invention.

FIG. 4 illustrates a schematic spiral inductors design according to various embodiments of the present invention. The inductors design comprises a first inductor $L_1$ 402 and a second inductor $L_2$ 404 that is counter wound relative to the first inductor $L_1$ 402. Both inductors 402, 404 have a common node A 406 with current flowing in each inductor as shown in FIG. 4. Specifically, the current flows in a first direction from node A 413 to node $B_1$ 422 and the current flows in a second direction, which is counter to the first direction, from node A 413 to node $B_2$ 424. As previously discussed, the currents in each inductor cause a magnetic field inside the coils of the inductors.

The current $I_1$ flowing in the first inductor $L_1$ 402 creates a magnetic field oriented out of the paper. The magnetic field produced by the second inductor $L_2$ 404 is oriented into the plane of the paper. Interference of the magnetic fields produced by the first inductor $L_1$ 402 and the second inductor $L_2$ 404 results in a cancellation effect at the points of interference. This cancellation reduces mutual inductance between the two inductors and allows for placement of inductors in a relatively closer proximity to each other.

C. Transient Phase Compliance

During change of current flowing in an individual inductor, a magnetic field produced by the inductor may change. For example, during a change in the current $I_1$ 412 flowing in the first inductor $L_1$ 402, a corresponding magnetic field produced by the first inductor $L_1$ 402 changes. The effect of the change results in a change in mutual inductance within the second inductor $L_2$ 404.

The change in mutual inductance may be addressed by changing the magnetic field generated by the second inductor $L_2$ 404. A corresponding change in current through the second inductor $L_2$ 404 to effectively cancel the change in the generated magnetic field. The currents flowing within the two inductors may relate to each other such that changes in one current result in a corresponding change in the other current. Accordingly, changes in a generated magnetic field may be compensated by changing the oppositely oriented magnetic field so that appropriate interference cancellation occurs. This interference cancellation results in a reduction of cross talk between the first inductor $L_1$ 402 and the second inductor $L_2$ 404.

One skilled in the art will recognize that the relationship between the first and second currents may be modeled using various techniques. Furthermore, the amount of cancellation may be modeled and varied depending on the magnitude of current change in one of the inductors. Additionally, one skilled in the art will recognize that the structures and manufacturing techniques used to create the inductors may be varied, all of which are intended to fall within the scope of the present invention.

Figure 5:
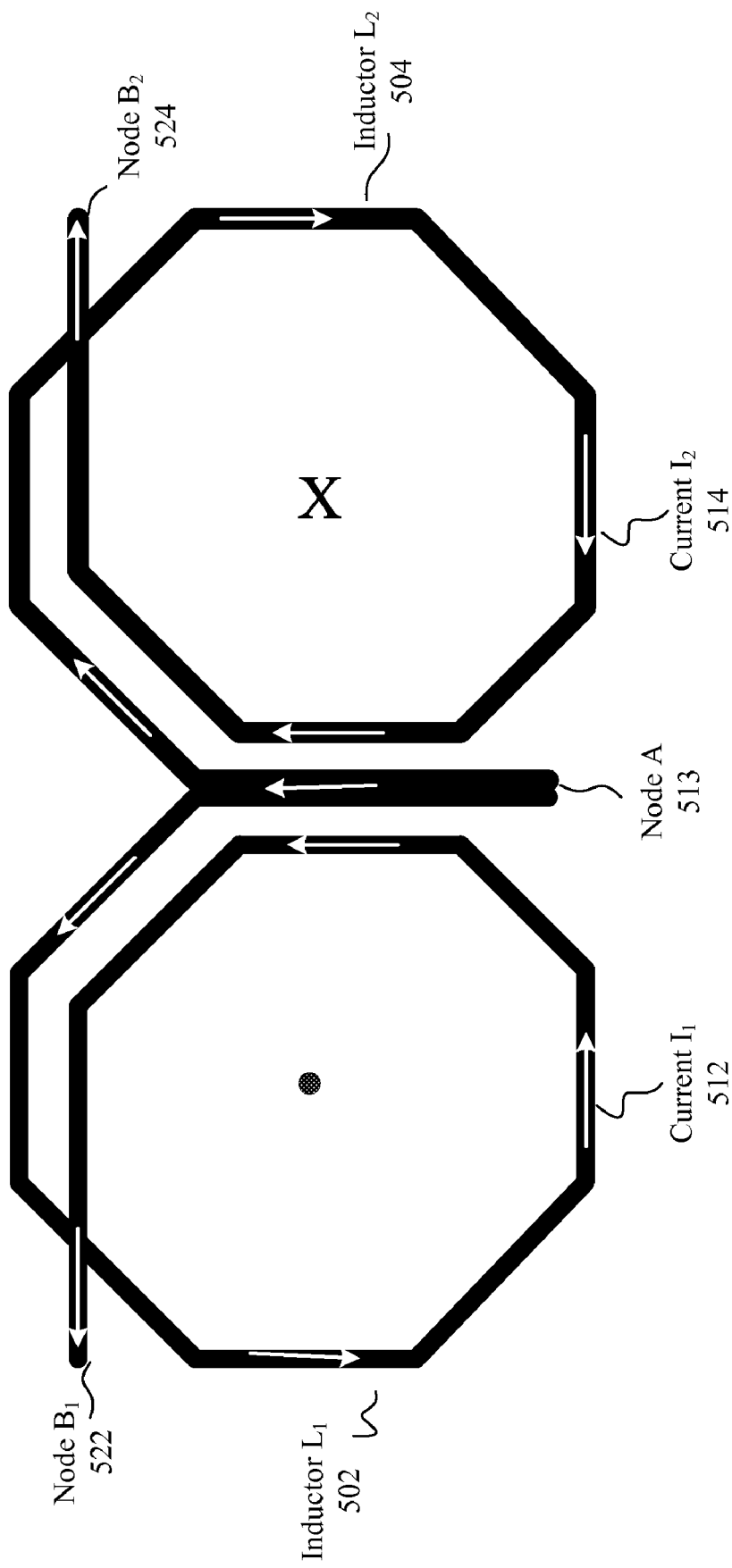
FIG. 5 shows an octagonal spiral inductor design according to various embodiments of the invention.

FIG. 5 illustrates an exemplary octagonal spiral inductor structure according to various embodiments of the invention. This octagonal spiral may be implemented to reduce the complexity of manufacturing. Similar to the inductor operation in FIG. 4, the current flow in the first inductor $L_1$ 502 is from node A 513 to node $B_1$ 522 resulting in a magnetic field as illustrated.

As previously described, a magnetic field oriented in an opposite direction is used to cancel at least a portion of the magnetic field generated from the first inductor $L_1$ 502. Particularly, the current flow in the second inductor $L_2$ 504 flows in a direction from node A 513 to node $B_2$ 524 generating an opposing magnetic field. The cancellation at interference points reduces cross talk between the two octagonal spiral inductors.

In implementations of circuits, such as a DLNA, where it may be advantageous to locate inductors proximate to each other, the present invention may be used. Additionally, the size of buffers between inductors may be reduced as a result of the inductance cancellation.

While the present invention has been described with reference to certain exemplary embodiments, those skilled in the art will recognize that various modifications may be provided. Accordingly, the scope of the invention is to be limited only by the following claims.

What is claimed is:

1. A multiple inductor array comprising:
    a first node that receives a first current and a second current;
    a first inductor coil, coupled to the first node and to a second node, that communicates the first current in a clockwise direction and generates a first magnetic field;
    a second inductor coil, coupled to the first node and to a third node, that communicates the second current in a counter clockwise direction and generates a second magnetic field having an opposing orientation to the first magnetic field; and
    wherein the first magnetic field and the second magnetic field at least partially cancel at an interference point.

2. The array of claim 1 wherein the first inductor coil and the second inductor coil are spiral structures.

3. The array of claim 1 wherein the first inductor coil and the second inductor coil are octagonal structures.

4. The array of claim 1 wherein a change in magnitude of the first magnetic field causes a change in magnitude of the second magnetic field.

5. The array of claim 1 wherein a change in magnitude of the second magnetic field causes a change in magnitude of the first magnetic field.

6. The array of claim 1 wherein the first and second currents flow within the same direction.

7. The array of claim 1 wherein the first and second currents flow in opposing directions.

8. The array of claim 1 wherein the magnitudes of the first and second currents are related so that a change in the first current causes a corresponding change in the second current in order to cause a reactionary interference cancellation.

9. The array of claim 1 further comprising a third inductor coil that generates a third magnetic field that cancels at least a portion of the first magnetic field.

10. The array of claim 1 further comprising a third inductor coil that generates a third magnetic field that cancels at least a portion of the second magnetic field.

11. A differential low noise amplifier comprising:
    a voltage supply that generates a first current and a second current;
    a first inductor coil, coupled to the voltage supply and to a first transistor, that communicates the first current in a first direction and generates a first magnetic field;
    a second inductor coil, coupled to the voltage supply, a second transistor, and in parallel with the first inductor coil, that communicates the second current in a second direction that is opposite to the first direction and generates a second magnetic field having an opposing orientation to the first magnetic field;
    a first RLC section that is coupled to the first inductor coil;
    a second RLC section that is coupled to the second inductor coil; and
    an output that is coupled to the first inductor coil, the second inductor coil, the first transistor, and the second transistor.

12. The amplifier of claim 11 wherein a first polarity of the first inductor coil is opposite to a second polarity of the second inductor coil.

13. The amplifier of claim 11 wherein the first and second inductor coils are spiral structured.

14. The amplifier of claim 11 wherein the first and second inductor coils are octagonal structured.

15. The amplifier of claim 11 wherein a change in magnitude of the first magnetic field causes a change in magnitude of the second magnetic field.

16. The amplifier of claim 1 wherein a change in magnitude of the second magnetic field causes a change in magnitude of the first magnetic field.

17. A method for reducing the amount of parasitic mutual inductance between inductors, the method comprising:
    generating a first magnetic field, from a first inductor coil communicating a first cuffent in a first direction;
    generating a second magnetic field, from a second inductor coil communicating a second current in a second direction that is opposite to the first direction, the second magnetic field having an opposing orientation to the first magnetic field; and
    canceling at least a portion of the first and second magnetic fields by magnetic cancellation resulting from the opposing orientations of the first and second magnetic fields.

18. The method of claim 17 wherein the magnitude of the first and second magnetic fields are related such that a change in the first magnetic field result in a change in the second magnetic field.

19. The method of claim 17 wherein the first and second magnetic coils are structured in an octagonal configuration.

20. The method of claim 17 wherein the first and second magnetic coils are structured in a spiral configuration.

* * * * *